(12) United States Patent
Chan et al.

(10) Patent No.: US 6,556,035 B2
(45) Date of Patent: Apr. 29, 2003

(54) TEST KEY LAYOUT FOR DETECTING VIA-OPEN FAILURE

(75) Inventors: Che-Kai Chan, Kaohsiung (TW); Chao-Hui Huang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 184 days.

(21) Appl. No.: 09/843,408

(22) Filed: Apr. 26, 2001

(65) Prior Publication Data

US 2002/0158649 A1 Oct. 31, 2002

(51) Int. Cl.[7] .............................................. G01R 31/26
(52) U.S. Cl. ..................... 324/765; 324/158.1
(58) Field of Search .......................... 324/158.1, 765, 324/751, 754, 763, 769; 257/48; 438/17, 18; 714/721

(56) References Cited

U.S. PATENT DOCUMENTS

| 5,262,719 A | * | 11/1993 | Magdo ..................... 324/158.1 |
| 5,949,240 A | * | 9/1999 | Yeh .............................. 324/754 |
| 6,133,055 A | * | 10/2000 | Yeh .............................. 438/18 |
| 6,191,602 B1 | * | 2/2002 | Huang Lu et al. .......... 324/765 |
| 6,452,412 B1 | * | 9/2002 | Jarvis et al. ................ 324/765 |

* cited by examiner

Primary Examiner—Kamand Cuneo
Assistant Examiner—Jimmy Nguyen

(57) ABSTRACT

A test key layout for finding open-via failures using an electron beam. Two types of test key layouts are designed. A first test key layout is used for finding open vias underneath even-numbered metallic layers while a second test key layout is used for finding open vias underneath odd-numbered metallic layers. A pair of neighboring metallic layers forms a group that has no direct electrical connection with other groups. The upper metallic layer in each group is in an open circuit state so that image contrast is enhanced.

8 Claims, 1 Drawing Sheet

TEST KEY LAYOUT FOR DETECTING VIA-OPEN FAILURE

BACKGROUND OF THE INVENTION

1. Field of Invention

The present invention relates to a test key layout. More particularly, the present invention relates to a test key layout for detecting via-open failure.

2. Description of Related Art

To increase product yield in mass production, most semiconductor manufacturers specifically design various types of test keys for finding defects in various component parts due to unexpected processing errors. Once a defective component is found, causes of failure can be investigated and later rectified.

In recent years, a number of methods for finding inter-metallic via-open failure have been developed. One method, for example, uses an electron beam as an incident source for failure detection. Most inspection methods include bombarding a test specimen with an electron beam and collecting the secondary electrons (SE) thus produced. Topographic information of the test specimen is obtained by gauging the secondary electrons.

Via-open failure detection using an electron beam is very much simplified if the test keys are laid out as a layer of metal over a substrate. In addition, the metallic layer is covered by a dielectric layer having a plurality of vias therein with each via having a metallic bonding pad thereon. When a beam of electrons shines on the test keys, vias in the closed state as well as vias in the open state underneath the metallic bonding pads are activated to produce secondary electrons. However, the vias in the closed state generate more secondary electrons than the vias in the open state. After photographic processing, bright spots appear in the closed vias while dark or fuzzy sports will appear in the open vias. Such a strong photographic contrast between open vias and closed vias serves to pinpoint the exact location of via-open failures in a test specimen.

Due to the miniaturization of semiconductor transistors in a silicon chip, most integrated circuit chips use two or more metallic layers for interconnection. In particular, four or five metallic layers are often used in multi-functional electronic products such as a microprocessor. As the number of interconnects increases, the finding of interconnect failures is increasingly critical, especially via-open failures. FIG. 1 is a schematic cross-sectional view showing a conventional test key layout for finding via-open failures in a multi-layered circuit.

As shown in FIG. 1, a substrate 100 having three metallic layers 101, 102 and 103 thereon to serve as interconnects for various devices is formed. The metallic layer 101 represents a first metallic layer ($M_1$), the metallic layer 102 represents a second metallic layer ($M_2$) and the metallic layer 103 represents a third metallic layer ($M_3$). A plurality of first vias ($V_1$) 104 is formed between the first metallic layer 101 and the second metallic layer 102. A plurality of second vias ($V_2$) 105 is formed between the second metallic layer 102 and the third metallic layer 103. A second via 106 between the second metallic layer 102 and the third metallic layer 103 is in an open state.

In general, the electron beam method for finding via-open failures in multi-layered interconnects is carried out in stages according to the formation sequence of inter-metallic vias. However, via-open failure detection is often not very accurate because in a conventional test key layout, various metallic layers are linked by vias. Hence, when an electron beam impinges upon an open-via such as 106, electrons are able to pass from the third metallic layer 103 down the closed-via 105 to reach the metallic layer 102 underneath. In fact, the flow of electrons in this manner is identical to the passage of electrons through closed-via 105. Therefore, for the second vias 105 and 106 underneath the third metallic layer 103, difference in activated secondary electrons for electron beam falling on the open-via 106 and the closed-via 105 is minor. Since contrast between the two vias 105 and 106 after photographic processing is small, indeterminate results are often obtained.

SUMMARY OF THE INVENTION

Accordingly, one object of the present invention is to provide a test-key layout for finding via-open failures such that photographic contrast is enhanced.

To achieve these and other advantages and in accordance with the purpose of the invention, as embodied and broadly described herein, the invention provides a test-key layout for finding via-open failures through an electron beam. The layout includes two types of test-key layout. One test-key layout is designed for testing the vias underneath even-numbered metallic layers. The other test-key layout is designed for testing the vias underneath odd-numbered metallic layers. Every pair of metallic layers is assigned into a group such that there is no interconnect for linking between the groups and the upper metallic layer in each group has an open circuit design. Furthermore, it does not matter if the metallic interconnect layer belongs to an odd or an even layer; a via-open failure analysis of the vias between metallic layers is conducted using the aforementioned two test-key layouts.

This invention provides a test-key layout for finding via-open failure. The test-key layout design includes assigning two metallic layers to a group with no linkage between each pair and forging an open-circuit design for the upper metallic layer in each group so that via-open failures are more prominent. Ultimately, via-open failures are more easily found and rectified, resulting in a higher product yield.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
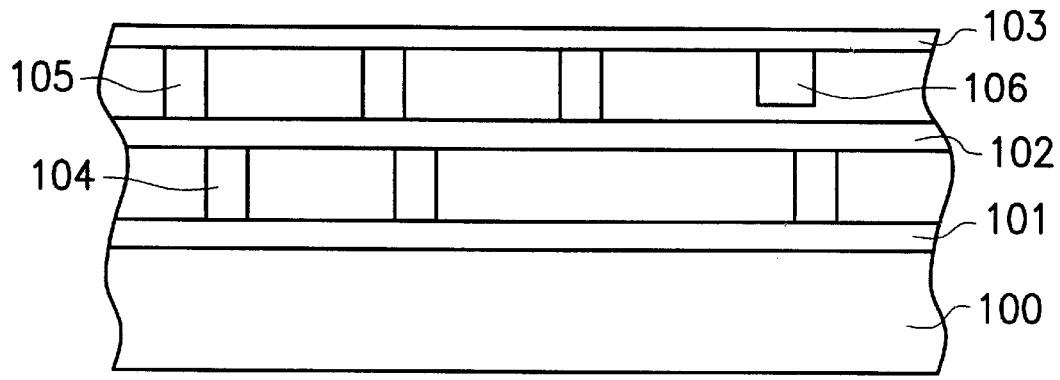
FIG. 1 is a schematic cross-sectional view showing a conventional test key layout for finding via-open failures in a multi-layered circuit.

Reference will now be made in detail to the present preferred embodiments of the invention, examples of which are illustrated in the accompanying drawings. Wherever possible, the same reference numbers are used in the drawings and the description to refer to the same or like parts.

In this invention, the test-key layout includes two types. One type of test-key layout is used for testing the vias underneath even-numbered metallic layers while the other type of test-key layout is used for testing the vias underneath odd-numbered metallic layers. In most electron beam methods of finding via-open failures, the inspection of multi-layered interconnects is carried out in sequence according to the order of formation of the vias. In other words, as soon as a first metallic layer, a second metallic layer and their intervening dielectric layer with first vias therein are formed, a via-open inspection of the first vias is carried out. As soon as a third metallic layer and an intervening dielectric layer with second vias therein between the third and the second metallic layer are formed, a via-open inspection of the second vias is carried out. This process is similarly repeated if the vias in subsequently formed dielectric layers needs to be inspected. Hence, to find via-open failures, both the test keys underneath even-numbered metallic layers and the test keys underneath odd numbered metallic layers must be used together.

Figure 2:
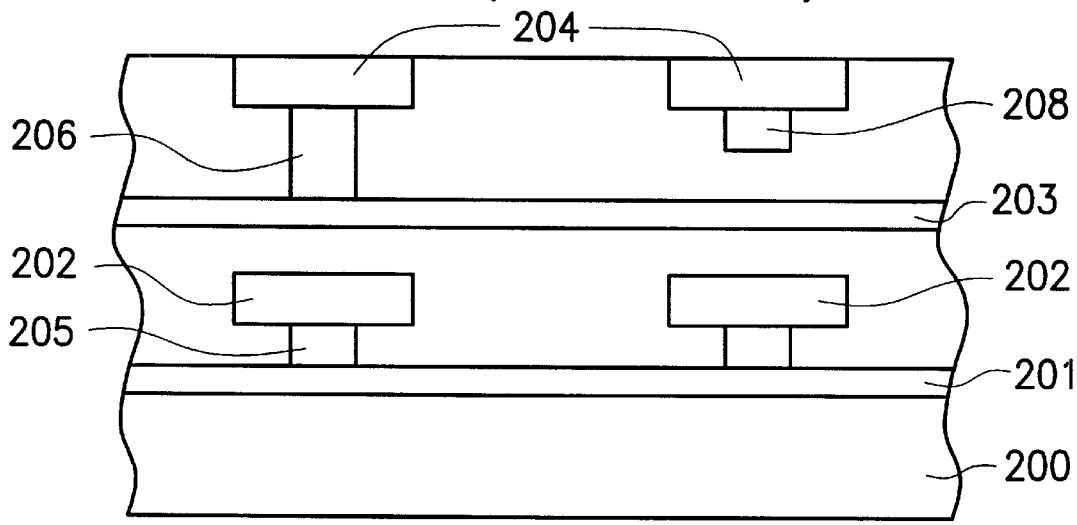
FIG. 2 is a schematic cross-sectional view showing a test-key layout for finding via-opening failures according to one preferred embodiment of this invention, in which the metallic layer above the to-be-inspected vias is an even-numbered metallic layer.

FIG. 2 is a schematic cross-sectional view showing a test-key layout for finding via-opening failures according to one preferred embodiment of this invention, in which the metallic layer above the to-be-inspected vias is an even-numbered metallic layer. As shown in FIG. 2, a substrate 200 having four metallic layers 201, 202, 203 and 204 thereon is provided. The metallic layer 201 represents a first metallic layer ($M_1$) and the metallic layer 202 represents a second metallic layer ($M_2$). Similarly, the metallic layer 203 represents a third metallic layer ($M_3$) and the metallic layer 204 represents a fourth metallic layer ($M_4$). The metallic layers 201 and 202 together form a first group and the metallic layers 203 and 204 together form a second group. The first and the second groups are not connected. The upper metallic layers 202 and 204 in each group are in an open state while the lower metallic layers 201 and 203 in each group are in a closed state or open state. In FIG. 2, the lower metallic layers 201 and 203 are shown in the closed state. A plurality of first vias ($V_1$) 205 is embedded in the dielectric layer between the first metallic layer 201 and the second metallic layer 202. Similarly, a plurality of third vias ($V_3$) 206 is embedded in the dielectric layer between the third metallic layer 203 and the fourth metallic layer 204. One of the third vias 208 is in an open state.

To find a via-open failure in the third via 208 in FIG. 2, an electron beam is used. Because test keys within the pair of metallic layers 201, 202 and the pair of metallic layers 203, 204 are independently connected systems, electrons entering the fourth metallic layer 204 only activate the third via 206 and the metallic layer 203 to produce secondary electrons. In addition, the fourth metallic layer 204 is in an open state. Hence, unlike a conventional design that permits the channeling of electrons to a lower metallic layer through closed vias, electrons entering the open-via 208 have nowhere to go. Consequently, a larger quantity of secondary electrons is produced by electrons passing through the close via 206 than by electrons passing through the open via 208. After photographic processing, a bright spot appears in the test key where the via 206 is located while a dark patch appears in the test key where the via 208 is located. The strong contrast between a closed and an open via serves as a method of finding via-open failure in even-number metallic layers.

Figure 3:
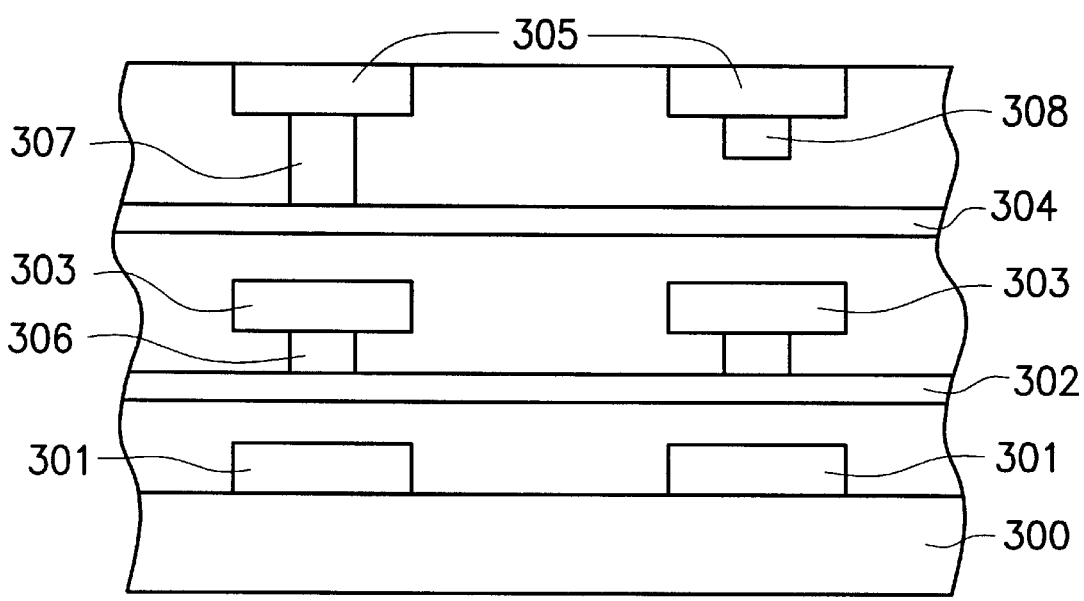
FIG. 3 is a schematic cross-sectional view showing a test-key layout for finding via-opening failures according to one preferred embodiment of this invention, in which the metallic layer above the to-be-inspected vias is an odd-numbered metallic layer.

FIG. 3 is a schematic cross-sectional view showing a test-key layout for finding via-opening failures according to one preferred embodiment of this invention, wherein the metallic layer above the to-be-inspected vias is an odd-numbered metallic layer.

As shown in FIG. 3, a substrate 300 having five metallic layers 301, 302, 303, 304 and 305 thereon is provided. The metallic layer 301 represents a first metallic layer ($M_1$), the metallic layer 302 represents a second metallic layer ($M_2$), the metallic layer 303 represents a third metallic layer ($M_3$), the metallic layer 304 represents a fourth metallic layer ($M_4$) and the metallic layer 305 represents a fifth metallic layer ($M_5$). The metallic layers 302 and 303 together form a first group while the metallic layers 304 and 305 together form a second group. The first and the second groups are not connected. The upper metallic layers 303 and 305 in each group are in an open state while the lower metallic layers 300, 302 and 304 in each group are in a closed state or open state. In FIG. 3, the lower metallic layers 300, 302 and 304 are shown in the closed state. A plurality of second vias ($V_2$) 306 is embedded in the dielectric layer between the second metallic layer 302 and the third metallic layer 303. Similarly, a plurality of fourth vias ($V_4$) 307 is embedded in the dielectric layer between the fourth metallic layer 304 and the fifth metallic layer 305. One of the fourth vias 308 is in an open state.

To find a via-open failure in the fourth via 308 in FIG. 3, an electron beam is used. Because test keys within the pair of metallic layers 302, 303 and the pair of metallic layers 304, 305 are independently connected systems, electrons entering the fifth metallic layer 305 only activate the fourth via 307 and the metallic layer 304 to produce secondary electrons. In addition, the fifth metallic layer 305 is in an open state. Hence, unlike a conventional design that permits the channeling of electrons to a lower metallic layer through closed vias, electrons entering the open-via 308 have nowhere to go. Consequently, a larger quantity of secondary electrons is produced by electrons passing through the close via 307 than by electrons passing through the open via 308. After photographic processing, a bright spot appears in the test key where the via 307 is located while a dark patch appears in the test key where the via 308 is located. The strong contrast between a closed and an open via serves as a method of finding via-open failure in odd-number metallic layers.

The electron beam method of finding via-open failure in interconnects requires at least two types of test keys to obtain a complete and precise image. In this invention, two types of test keys are used. A set of test keys is used for testing the vias underneath even-numbered metallic layers and a second set of test keys is used for testing the vias underneath odd-numbered metallic layers. Every pair of neighboring metallic layers forms a group and each group has no direct linkage with another group. The upper metallic layer in each group is designed to be in an open state so that all open vias are made to stand out after image processing. Hence, via-open failures can be found and rectified so that product yield is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A test key layout for finding via-open failures, comprising:

a first test key layout for finding open vias underneath even-numbered metallic layers, wherein the first test key layout includes a substrate, a first plurality of vias, a plurality of metallic layers over a substrate such that all even-numbered metallic layers are in an open circuit state, and the first plurality of vias is within a dielectric layer underneath an even-numbered metallic layer but above an odd-numbered metallic layer; and a second test key layout for finding open vias underneath odd-numbered metallic layer, wherein the second test key layout includes a substrate, a second plurality of vias, a plurality of metallic layers over the substrate such that all even-numbered metallic layers are in a closed circuit state, and the second plurality of vias is within a dielectric layer underneath an odd-numbered metallic layer but above an even-numbered metallic layer.

2. The test key layout of claim 1, wherein the odd-numbered metallic layers in the first test key layout are in open circuit state.

3. The test key layout of claim 1, wherein the odd-numbered metallic layers in the first test key layout are in a closed circuit state.

4. The test key layout of claim 1, wherein the even-numbered metallic layers in the second test key layout are in open circuit state.

5. The test key layout of claim 1, wherein the even-numbered metallic layers in the second test key layout are in a closed circuit state.

6. A test key layout for finding via-open failures, comprising:

a substrate;

a plurality of metallic layers over the substrate, wherein every pair of neighboring metallic layers forms a group that has no direct electrical connection with other groups, and an upper metallic layer of each group is in an open circuit state; and a plurality of vias between the metallic layers in each group.

7. The test key layout of claim 6, wherein the lower metallic layer in each group is in an open circuit state.

8. The test key layout of claim 6, wherein the lower metallic layer in each group is in a closed circuit state.

* * * * *